United States Patent
Lee et al.

(10) Patent No.: US 8,033,378 B2
(45) Date of Patent: Oct. 11, 2011

(54) BUFFER SYSTEM FOR ADJUSTING FIRST-IN FIRST-OUT

(75) Inventors: Sung-Hee Lee, Chungcheongnam-do (KR); Myung-Jin Lee, Chungcheongnam-do (KR)

(73) Assignee: Semes Co., Ltd. (KR)

( * ) Notice: Subject to any disclaimer, the term of this patent is extended or adjusted under 35 U.S.C. 154(b) by 506 days.

(21) Appl. No.: 11/820,675

(22) Filed: Jun. 20, 2007

(65) Prior Publication Data

US 2008/0005881 A1 Jan. 10, 2008

(30) Foreign Application Priority Data

Jun. 23, 2006 (KR) ........................ 10-2006-0057077

(51) Int. Cl.
*B65G 1/00* (2006.01)
(52) U.S. Cl. ..................... 198/347.1; 414/935
(58) Field of Classification Search ............. 414/222.01, 414/674, 935, 609; 198/347.1, 347.2, 435, 198/347.3
See application file for complete search history.

(56) References Cited

U.S. PATENT DOCUMENTS

| | | | | |
|---|---|---|---|---|
| 2,536,756 A | * | 1/1951 | Lopez | 414/152 |
| 5,881,649 A | * | 3/1999 | Hasegawa et al. | 104/167 |
| 5,989,342 A | * | 11/1999 | Ikeda et al. | 118/52 |
| 6,280,135 B1 | * | 8/2001 | Cunningham | 414/280 |
| 6,591,962 B2 | * | 7/2003 | Miyake | 198/347.1 |
| 6,681,916 B2 | * | 1/2004 | Hiroki | 198/347.1 |
| 7,168,905 B1 | * | 1/2007 | Solomon et al. | 414/237 |
| 7,497,317 B2 | * | 3/2009 | Chang et al. | 198/370.09 |
| 2003/0202865 A1 | * | 10/2003 | Ponnekanti et al. | 414/217 |
| 2006/0174829 A1 | * | 8/2006 | An et al. | 118/52 |
| 2006/0177288 A1 | * | 8/2006 | Parker et al. | 414/217 |
| 2010/0080673 A1 | * | 4/2010 | Von Der Waydbrink et al. | 414/222.01 |

FOREIGN PATENT DOCUMENTS

| | | |
|---|---|---|
| JP | 2002-329761 A | 11/2002 |
| JP | 2005-074287 A | 3/2005 |
| JP | 2007-250671 A | 9/2007 |

\* cited by examiner

*Primary Examiner* — Joshua Rudawitz
(74) *Attorney, Agent, or Firm* — Myers Bigel Sibley & Sajovec, P.A.

(57) ABSTRACT

Provided is a buffer system for adjusting first-in first-out, more particularly, a buffer system that temporarily stores a plurality of substrates and is capable of adjusting first-in first-out. The buffer system includes one or more buffer layers having shafts and rollers fitted and fixed to the shafts so as to temporarily store or transfer substrates, a vertically moving unit moving the buffer layers up or down such that a buffer layer having thereon a substrate to be transferred is connected to a driving unit, and the driving unit rotating the shafts of the buffer layer having thereon the substrate to be transferred to transfer the substrate.

6 Claims, 5 Drawing Sheets

BUFFER SYSTEM FOR ADJUSTING FIRST-IN FIRST-OUT

CROSS REFERENCE TO RELATED APPLICATION

This application claims priority from Korean Patent Application No. 10-2006-0057077 filed on Jun. 23, 2006 in the Korean Intellectual Property Office, the disclosure of which is incorporated herein by reference in its entirety.

BACKGROUND OF THE INVENTION

1. Field of the Invention

The present invention relates to a buffer system for adjusting first-in first-out, and more particularly, to a buffer system that temporarily stores a plurality of substrates and is capable of adjusting first-in first-out.

2. Description of the Related Art

In general, a buffer apparatus refers to an apparatus that temporarily stores substrates during a series of processes in a semiconductor process or a process of manufacturing flat panel displays. When time varies depending on a process to be performed in a series of processes or any one of the processes temporarily stops, the buffer apparatus may provide a space where substrates in other processes can temporarily stay. For example, the buffer apparatus may be used between a cleaning process and a thin film deposition process, or between the cleaning process and an inspection process, which are performed at different operating speeds to adjust operation time of the entire manufacturing process.

FIG. 1 is a schematic view illustrating a buffer apparatus according to the related art.

The known buffer apparatus has therein a vertically movable transfer unit to store substrates that are transferred to the buffer apparatus, and moves the substrates to an upper portion thereof. As a result, the substrate transferred first is positioned at the upper portion of the buffer apparatus. Therefore, in order to transfer the substrates stored in the buffer apparatus to a process apparatus of the next process, the lowermost substrate is transferred first. This is because a device for transferring a substrate is driven by the rotation of rollers that are mounted to the lowest shafts.

As a result, since the substrate entered first is transferred last, the substrate entered first stays relatively longer in the buffer apparatus. As the substrate stays longer in the buffer apparatus, dust or a foreign substance may be adhered to the substrate. Further, although though the substrate needs to undergo the next process after the previous process before a predetermined time, the next process is performed even after the predetermined time, which results in low yield.

In addition, a system for individually transferring substrates by a robot to adjust first-in first-out needs an expensive robot, which increases the manufacturing cost.

SUMMARY OF THE INVENTION

An object of the present invention is to provide a buffer system that has a vertically moving unit therein and is capable of adjusting first in first out for substrates.

Objects of the present invention are not limited to those mentioned above, and other objects of the present invention will be apparently understood by those skilled in the art through the following description.

According to an aspect of the present invention, there is provided a buffer system for adjusting first-in first-out, the system including the one or more buffer layers having shafts and rollers fitted and fixed to the shafts so as to temporarily store or transfer substrates; a vertically moving unit moving the buffer layers up or down such that a buffer layer having thereon a substrate to be transferred is connected to a driving unit; and the driving unit rotating the shafts of the buffer layer having thereon the substrate to be transferred to transfer the substrate.

BRIEF DESCRIPTION OF THE DRAWINGS

The above and other features and advantages of the present invention will become more apparent by describing in detail preferred embodiments thereof with reference to the attached drawings, in which.

DESCRIPTION OF THE PREFERRED EMBODIMENTS

Figure 1:
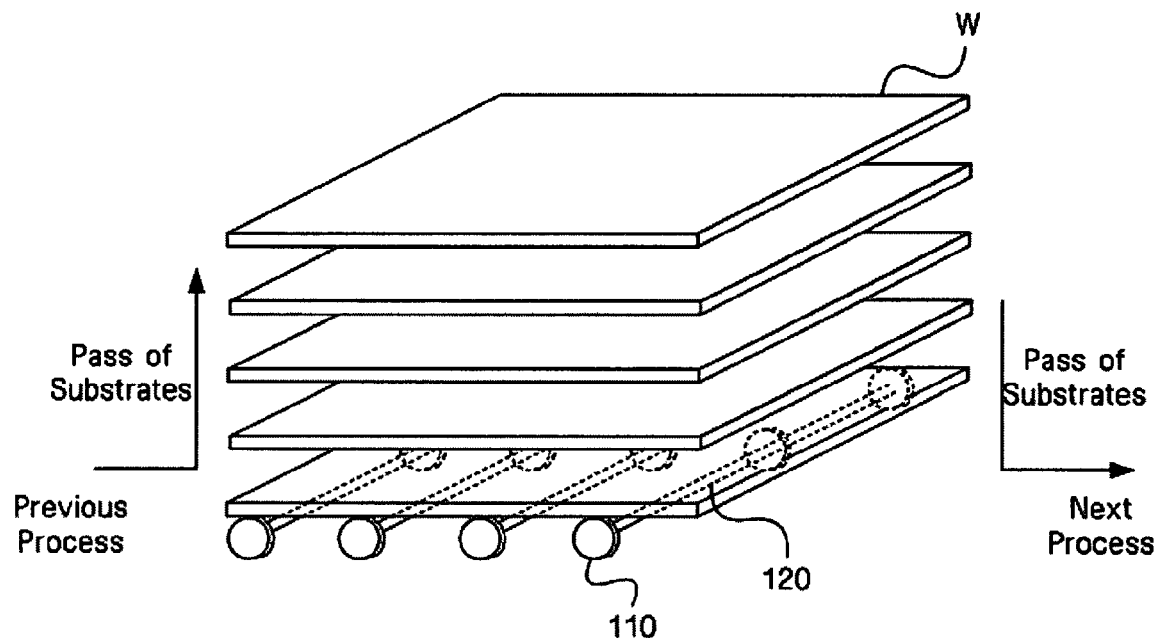
FIG. 1 is a schematic view illustrating a buffer apparatus according to the related art.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will now be described more fully with reference to the accompanying drawings, in which preferred embodiments of the invention are shown.

Figure 2:
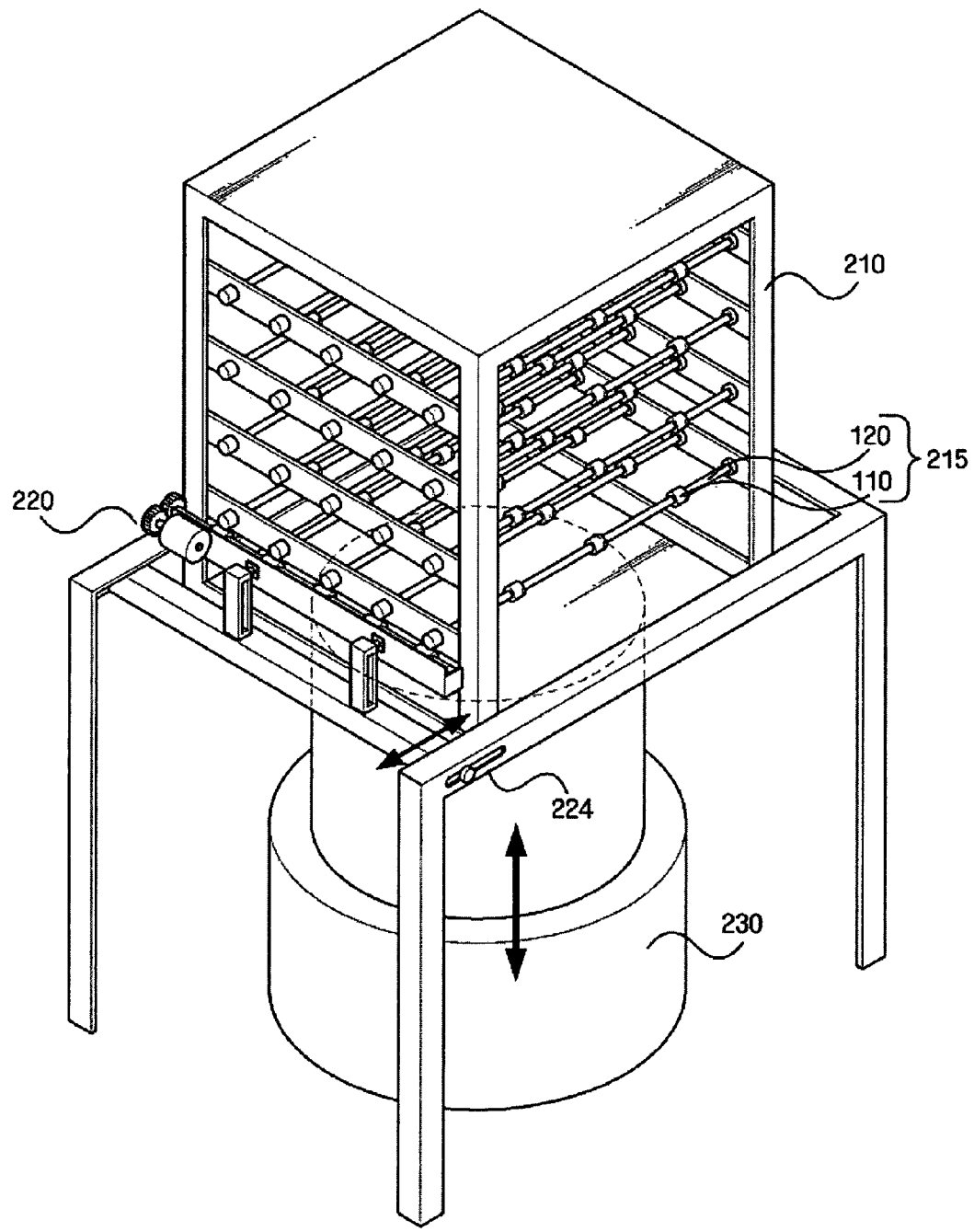
FIG. 2 is a perspective view illustrating a buffer system for adjusting first-in first-out according to an embodiment of the present invention.
Figure 3A:
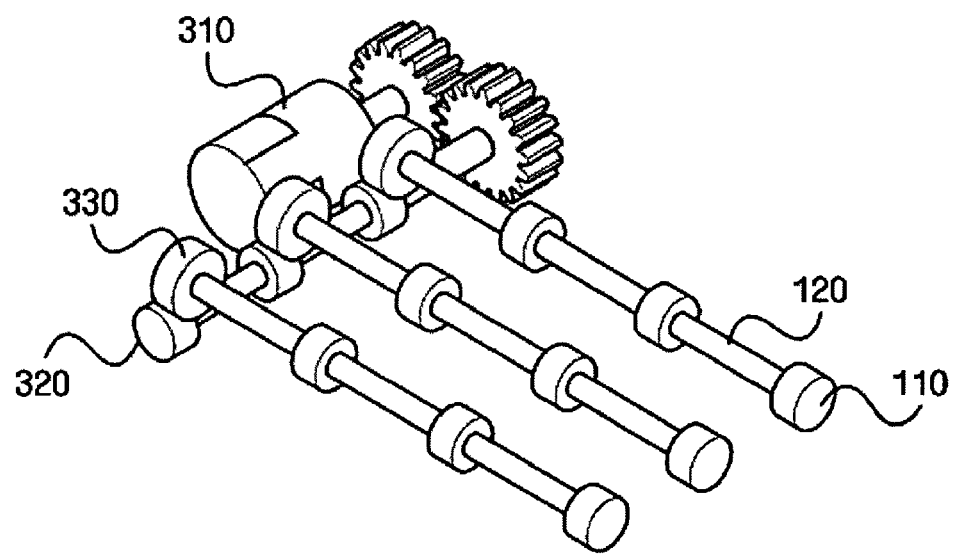
FIG. 3A is a schematic view illustrating a driving unit of a buffer system for adjusting first-in first-out according to an embodiment of the present invention.

FIG. 2 is a perspective view illustrating a buffer system for adjusting first-in first-out according to an embodiment of the present invention. FIG. 3A is a schematic view illustrating a driving unit in the buffer system for adjusting first-in first-out according to an embodiment of the present invention.

A buffer system for adjusting first-in first-out according to an embodiment of the present invention includes one or more buffer layers having shafts and rollers fitted and fixed to the shafts so as to temporarily store or transfer substrates, a driving unit rotating the shafts of one of the buffer layers and transferring the substrate; and a vertically moving unit moving the buffer layers up or down. Further, the buffer system may include a buffer body that has holes for supporting the shafts.

As shown in FIG. 2, a buffer body 210 supports one or more buffer layers 215. The buffer body 210 can provide a space for accommodating the buffer layers 215 as many as substrates that can temporarily be stored in the buffer system. That is, the buffer system having a plurality of buffer layers 215 may have a relatively high space. The buffer body 210 has the buffer layers 215 arranged at predetermined intervals therebetween.

The buffer layers 215 temporarily store the substrates. Further, the buffer layers 215 may further have units for transferring the substrates when the substrates need to be transferred. A plurality of buffer layers 215 may be provided such that the substrates can temporarily be stored. A substrate, which has been transferred in the previous process, can be transferred to the buffer layer 215 by the buffer system. Further, the buffer layer 215 may temporarily store the substrate in the buffer system and then transfer the substrate to the next process.

The unit for transferring the substrate may include shafts 120 serving as rotary shafts and rollers 110 capable of transferring the substrate by the rotation of the shafts 120. Since the roller 110 is fixed to the shaft 120, the roller 110 can also rotate by the rotation of the shaft 120. Therefore, the substrate on the rollers 110 can be transferred in one direction by the rotation of the rollers 110. The transfer unit serves to support the substrate so as to temporarily store the substrate, and when the substrate needs to be transferred, the transfer unit serves as the transfer unit.

In the known buffer apparatus shown in FIG. 1, the transfer unit is provided at a lower end, and an edge portion of the temporarily stored substrate is supported at an upper end such that the substrate can be moved up or down. Therefore, in order to transfer the substrate having moved toward the upper end to the next process, the substrate at the lower end is transferred, and then the substrate stored at the upper end is moved toward the lower end.

Referring to FIG. 2 and FIG. 3A, a driving unit 220 serves to rotate the shaft 120 of the buffer layer 215. In general, the driving unit 220 includes a power unit 310 for generating power and power transmission units 320 and 330 for transmitting mechanical or electrical power to the power unit 310. The power unit 310 is a part for generating power, and may include a motor driven by electrical power or an engine for converting chemical energy to mechanical movement.

Various types of power transmission units 320 and 330 may be provided to transmit the power generated by the power unit 310. For example, as shown in FIG. 3, magnetic helical gears 320 and 330 may be used. Even though the name "helical gear" is used, the helical gear substantially serves as a worm gear in which the driven gear 330 perpendicular to the driving gear 320 is rotated by the rotation of the driving gear 320.

Figure 3B:
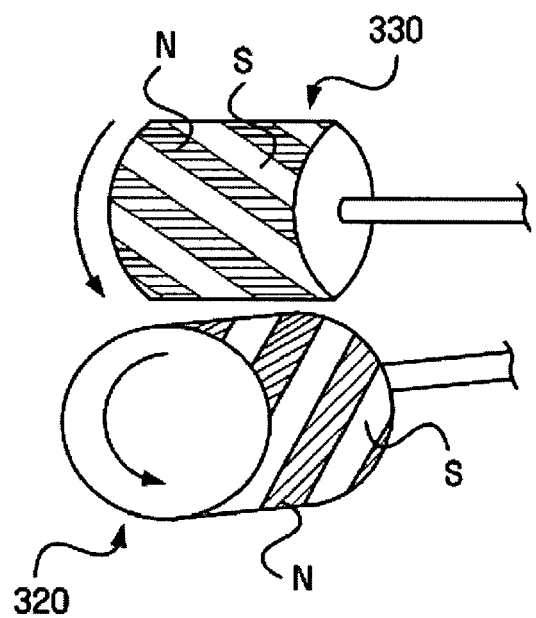
FIG. 3B is a view showing the principle of magnetic helical gears of a buffer system for adjusting first-in first-out according to an embodiment of the present invention.

FIG. 3B is a view showing the principle of magnetic helical gears in a buffer system for adjusting first-in first-out according to an embodiment of the present invention.

In general, gears mean a structure in which teeth of the gears mesh with each other to transmit power to another shaft. However, when magnets are used, it is possible to transmit power without direct engagement between the teeth of the gears. As shown in FIG. 3B, the shafts of the driving gear 320 and the driven gear 330 are positioned at an angle of 90°, and magnets having N and S poles are attached on an edge portion of the gears in a direction inclined at a predetermined angle. Therefore, when the driving gear 320 rotates, attractions are produced between the N pole of the driving gear 320 and the S pole of the driven gear 330 corresponding thereto, and between the S pole of the driving gear 320 and the N pole of the driven gear 330 corresponding thereto, such that the driven gear 330 can rotate. Therefore, even though the shafts are crossed at an angle of 90° and the teeth of the gears do not engage with each other, the driven gear 330 is rotated to transfer the substrate.

Figure 4A:
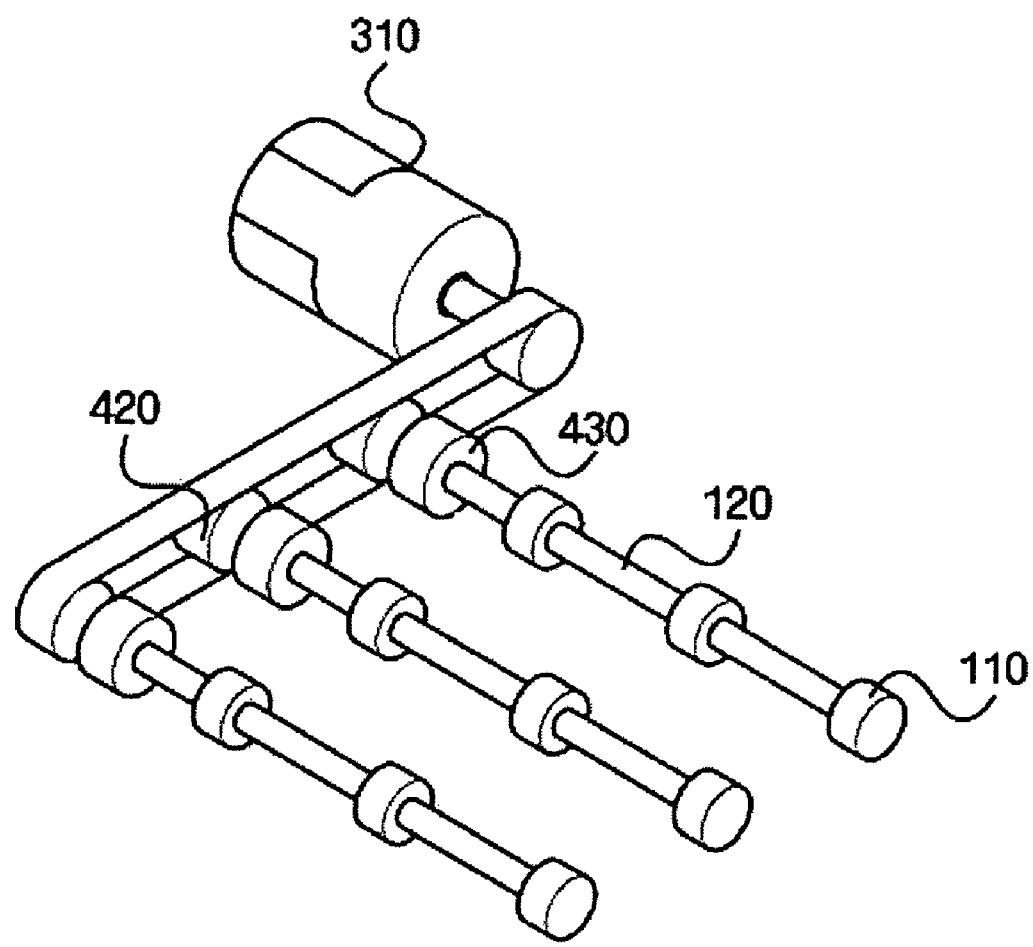
FIG. 4A is a schematic view a magnetic disc driving unit of a buffer system for adjusting first-in first-out according to an embodiment of the present invention.
Figure 4B:
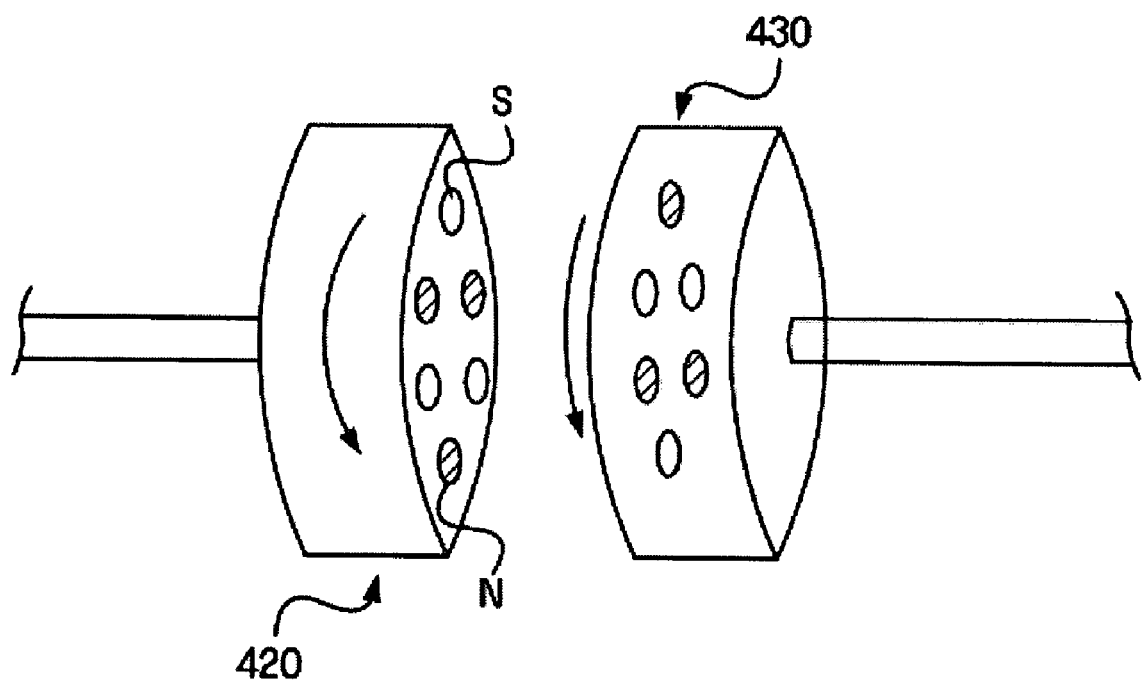
FIG. 4B is a view showing the principle of magnetic disc gears of a buffer system for adjusting first in first out according to an embodiment of the present invention.

FIG. 4A is a schematic view illustrating a magnetic disc driving unit in a buffer system for adjusting first-in first-out according to an embodiment of the present invention, and FIG. 4B is a view showing the principle of magnetic disc gears in a buffer system for adjusting first-in first-out according to an embodiment of the present invention.

In a method of transmitting power by using magnetism like the magnetic helical gears, magnetic disc gears, for example, can be used.

As shown in FIG. 4A, when a driving gear 420 is rotated by a driving unit, it is possible to rotate a driven gear 430 in parallel with the driving gear 420. As shown in FIG. 4B, magnets are attached to the driving gear 420 and the driven gear 430 that face each other such that the attached magnets correspondingly face each other. As a result, attraction between the magnets is applied, and when the driving gear 420 rotates, it is possible to rotate the driven gear 430 in conjunction with the driving gear 420.

The above-described magnetic gears 320, 420, 330, and 430 can be driven in a state in which the gears are not in contact with each other, but are spaced from each other by a predetermined distance. Therefore, since the buffer layer can be moved up or down, it is possible to rotate the driven gear by the driving unit 220 at the buffer layer having thereon a substrate to be transferred. The driving unit 220 may include a slider 224 or a rail. The driving unit 220 may move left to right on the slider 224 and the rail. Therefore, when the buffer layer 215 moves up or down, the driving unit 220 is moved backward to facilitate the movement of the buffer layer 215.

A vertically moving unit 230 moves one or more buffer layers 215 up or down. In order to move the buffer layers 215 up or down, a plurality of buffer layers 215 may be attached to the one buffer body 210. Therefore, the vertically moving unit 230 can move the buffer layers 215 up or down by moving the buffer body 210 up or down.

In order to move the buffer layers 215 up or down, a piston 230 may be mounted to a lower portion of the body. The piston 230 needs to match the height of the buffer layer 215 having thereon the substrate to be transferred by the driving unit 220 with that of the driving unit 220 such that the substrate can be transferred to the next process. The driving unit 220 may be moved up or down, which may cause the inconveniences of transferring the substrates to the next process.

In addition to the piston, a screw gear may be used as the vertically moving unit. The piston or the screw gears may be positioned under the buffer body or above the buffer body.

In general, the substrate entered first is stored upward and positioned at the uppermost portion. Therefore, the vertically moving unit 230 can lower the uppermost buffer layer to the height of the driving unit such that a substrate on the uppermost buffer layer 215 can be transferred to the next process. In this way, it is possible to realize the buffer system that is capable of adjusting first-in first-out for substrates by sequentially transferring the buffer layers from the uppermost buffer layer to the lowermost buffer layer.

Similarly, it is assumed that a substrate of the uppermost buffer layer has been transferred and the next substrate is to be transferred to the next process. However, when there was a substrate to be transferred to the buffer system in the previous process and the substrate has already been placed on the uppermost buffer layer, it cannot be said that the substrate is entered first even though the substrate exists on the uppermost buffer layer. Therefore, in this case, the vertically moving unit may sense time how long substrates have temporarily been staying on the respective buffer layers, and sequentially transfer the substrates from the oldest substrate first to the next process. To do so, a time sensor for sensing time for which a substrate stays on a buffer layer may be further included. That is to say, it is possible to release the buffer system capable of adjusting first-in first-out for the substrates when the substrates are transferred to the next process by sensing the time for which the substrates stay on the buffer layers.

The operation of the buffer system for adjusting first-in first-out having the above-described construction according to the embodiment of the present invention will be described.

First, since a substrate in the previous process cannot immediately proceed to the next process, the substrate may temporarily be stored in the buffer system. A substrate that has already occupied one buffer layer 215 in the buffer system rises up to an upper buffer layer, and the newly transferred substrate is placed on a lower buffer layer. As substrates are stored according to this method, the substrate entered first can be stored on a buffer layer at an upper end. Therefore, in order to transfer first the substrate entered first, the substrate of the buffer layer at the upper end may be transferred first to the next process. As the buffer body is moved down by the vertically moving unit 230, it is possible to move the buffer layer 215 downward. Here, the buffer layer 215 may be moved to the height at which the roller 110 in the buffer layer 215 comes in contact with the driving unit 220 so as to be driven.

When the buffer layer 215 having thereon the substrate to be transferred reaches the height at which the driving unit 220 can operate, the driving unit 220 rotates the driving motor 310 to transmit power to the power transmission units. For example, the driving gear 320 is rotated by using the magnetic helical gears 320 and 330, and the driving gear 320 rotates the driven gear 330 of the buffer layer 215 which is attached to the driving gear 320 at an angle of 90°. Further, the shaft 120 and the roller 110 attached to the shaft 120 are rotated, such that the substrate can be transferred to the next process. Alternatively, when the magnetic disc gears 420 and 430 are used, the driving gear 420 rotates the driven gear 430 in parallel with the driving gear 420, such that the substrate in the buffer layer 215 can be transferred to the next process.

According to the same method as the above, in order to transfer the next substrate, the buffer layer 215 having thereon the substrate to be transferred by the vertically moving unit 230 is made to reach the height of the driving unit 220. When the buffer layer 215 reaches the height of the driving unit 220, the driving unit 220 can transfer the substrate on the buffer layer 215 to the next process.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

According to the above-described buffer system for adjusting first-in first-out, the following effects can be obtained.

It is possible to maintain balance in the process by adjusting first-in first-out for substrates and making waiting time equal in the buffer system.

Further, it is possible to prevent a foreign material from being placed on a substrate by relatively reducing the waiting time in the buffer system.

Effects of the present invention are not limited to those mentioned above, and other effects of the present invention will be apparently understood by those skilled in the art through the appended claims.

What is claimed is:

1. A buffer system for adjusting first-in first-out, the system comprising:
a frame;
a driving unit secured to the frame via a rail, wherein the rail is movable within a slot located within the frame;
a buffer body supporting a plurality of buffer layers, each buffer layer having shafts and rollers fitted and fixed to the shafts so as to temporarily store or transfer substrates, wherein the buffer body is vertically movable relative to the frame;
a vertically moving unit that moves the buffer body up or down relative to the frame such that a respective buffer layer having thereon a substrate to be transferred is connected to the driving unit, wherein the driving unit moves backwards away from the buffer body via the movable rail to facilitate vertical movement of the buffer body; and
a time sensor for sensing time for which a substrate stays on a buffer layer,
wherein the driving unit rotates the shafts of a buffer layer connected thereto to transfer the substrate.

2. The buffer system of claim 1, wherein the buffer body has holes for supporting the shafts therein.

3. The buffer system of claim 1, wherein the driving unit rotates the shafts of the buffer layer by using magnetic helical gears.

4. The buffer system of claim 1, wherein the driving unit rotates the shafts of the buffer layer by using magnetic disc gears.

5. The buffer system of claim 1, wherein the vertically moving unit stores the order of the buffer layers of the substrates entered first and moves the buffer layers up or down to carry out the substrates according to the stored order.

6. The buffer system of claim 1, wherein the vertically moving unit moves the buffer layers up or down by means of a piston or a screw gear.

* * * * *

UNITED STATES PATENT AND TRADEMARK OFFICE
CERTIFICATE OF CORRECTION

| | | |
|---|---|---|
| PATENT NO. | : 8,033,378 B2 | Page 1 of 1 |
| APPLICATION NO. | : 11/820675 | |
| DATED | : October 11, 2011 | |
| INVENTOR(S) | : Lee et al. | |

It is certified that error appears in the above-identified patent and that said Letters Patent is hereby corrected as shown below:

On the Title Page:
Item (56), References Cited, Foreign Patent Documents:
Please add -- JP   2000-031238   1/2000 --

Signed and Sealed this
Thirty-first Day of January, 2012

David J. Kappos
*Director of the United States Patent and Trademark Office*